United States Patent [19]
Brainerd et al.

[11] Patent Number: 5,667,918
[45] Date of Patent: Sep. 16, 1997

[54] METHOD OF LITHOGRAPHY USING RETICLE PATTERN BLINDERS

[75] Inventors: Steve K. Brainerd, Tigard, Oreg.; J. Brett Rolfson, Boise, Id.

[73] Assignee: Micron Technology, Inc., Boise, Id.

[21] Appl. No.: 495,040

[22] Filed: Jun. 27, 1995

Related U.S. Application Data

[63] Continuation-in-part of Ser. No. 127,430, Sep. 27, 1993, abandoned.

[51] Int. Cl.$^6$ ............................................. G03F 1/14
[52] U.S. Cl. .................. 430/5; 430/8; 430/296; 430/321; 430/396
[58] Field of Search .......................... 430/5, 8, 321, 430/396, 296

[56] References Cited

U.S. PATENT DOCUMENTS

| | | | |
|---|---|---|---|
| 4,326,805 | 4/1982 | Feldman et al. | 356/399 |
| 4,711,535 | 12/1987 | Shafer | 350/442 |
| 4,849,313 | 7/1989 | Chapman et al. | 430/5 |
| 4,947,413 | 8/1990 | Jewell et al. | 378/34 |
| 5,003,342 | 3/1991 | Nishi | 355/43 |
| 5,045,417 | 9/1991 | Okamoto | 430/5 |
| 5,242,770 | 9/1993 | Chen et al. | 430/5 |
| 5,439,765 | 8/1995 | Nozue | 430/5 |
| 5,447,810 | 9/1995 | Chen et al. | 430/5 |

OTHER PUBLICATIONS 0.35μm "Lithography Using Off–Axis Illumination", by Luehrmann et al., SPIE–Optical/Laser Microlithography VI Conference Mar. 1993, San Jose, California.

"Subhalf Micron Lithography System with Phase–Shifting Effect", Noguchi et al., *SPIE* vol. 1674, Optical/Laser Microlithography V (1992) pp. 92–104.

"New Imaging Technique for 64M–DRAM", Shiraishi et al., *SPIE* vol. 1674 Optical/Laser Microlithography V (1992), pp. 741–752.

*Primary Examiner*—George F. Lesmes
*Assistant Examiner*—Bernard P. Codd
*Attorney, Agent, or Firm*—Stephen A. Gratton

[57] ABSTRACT

An improved reticle pattern for semiconductor lithography systems that utilize partially coherent or off-axis illumination includes blinder structures located adjacent to the exterior features of the reticle pattern. The blinder structures protect the exterior features from light that is scattered from large low resolution areas of the reticle in a defocus mode of the lithography system. This protects the exterior features projected onto a semiconductor wafer from degradation and improves the resolution, contrast and depth of focus of the lithographic system. In an illustrative embodiment, the reticle pattern is formed as a simple grating in which the exterior features of the grating are protected from image degradation by blinder structures formed as one or more solid blinder lines.

24 Claims, 5 Drawing Sheets

1

METHOD OF LITHOGRAPHY USING RETICLE PATTERN BLINDERS

This is a continuation-in-part of application Ser. No. 08/127,430 filed Sep. 27, 1993, now abandoned.

FIELD OF THE INVENTION

This invention relates to optical lithographic systems and more particularly to optical lithographic systems that are suitable for use in semiconductor manufacture in the fabrication of semiconductor wafers.

BACKGROUND OF THE INVENTION

In semiconductor manufacture microlithography is used in the formation of integrated circuits on a semiconductor wafer. During a lithographic process, a form of radiant energy, such as ultraviolet light, is passed through a mask or reticle and onto the semiconductor wafer. The reticle contains opaque and transparent regions formed in a desired pattern. A grating pattern, for instance, may be used to define parallel spaced conducting lines on a semiconductor wafer. The ultraviolet light exposes the reticle pattern on a layer of resist formed on the wafer. The resist is then developed for removing either the exposed portions of resist for a positive resist or the unexposed portions of resist for a negative resist. The patterned resist can then be used during a subsequent semiconductor fabrication process such as ion implantation or etching.

As microcircuit densities have increased, the size of the features of semiconductor devices have decreased to the submicron level. These submicron features may include the width and spacing of metal conducting lines or the size of various geometric features of semiconductor devices. The requirement of submicron features has necessitated the development of improved microlithographic processes and systems. As an example, phase shifting microphotolithographic processes use phase shifting reticles to phase shift the exposure radiation at the edges of a pattern to increase the image contrast. Other sub-micron microlithographic processes include e-beam writing and holographic lithography.

Different microlithographic illumination systems have also been recently developed for improving the resolution and depth of focus of fine microlithographic patterns in the half to sub half micron region. In general, the two types of illumination that are most useful for sub micron microlithography are partially coherent illumination and off-axis illumination. These different illumination systems illuminate the reticle in different ways altering the Fraunhofer diffraction pattern in the Fourier transfer plane. The Fraunhofer diffraction pattern or spectrum of an illuminated object is its Fourier transform. This "filtering" or modification of the transform pattern has a very significant effect on the resulting image.

Partially coherent illumination is concerned with spatial rather than temporal coherence and is achieved by under filling the entrance pupil in a Koehler type illumination system. Koelher illumination is where the exposure source is projected through a condenser lens and focused in an entrance pupil plane of the objective lens. This under filling of the entrance pupil is achieved by reducing the source diameter typically with aperture stops. This partially coherent illumination filters or blocks the diffracted light orders from the objects high frequency features, which increases the image contrast on the low and medium frequency features. This contrast improvement is achieved because the scattered low modulation diffracted light from the high frequency features is absent.

FIG. 1 illustrates a lithographic system 10 with partially coherent illumination. The partially coherent lithographic system 10 includes a source 12 of radiant energy such as UV light. The light from the source 12 passes through an aperture 14 and a condenser lens system 16. A reticle 18 (object plane) is positioned at the exit pupil of the condenser lens system 16 and is illuminated by the light beam emerging from the condenser lens system 16. Light passed through the aperture 14 is then focused into the entrance pupil 22 of an objective lens 24. The objective lens 24 focuses this light on the wafer 20 which is located at the image plane. The reticle 18 is formed of opaque and transparent areas for forming a desired pattern on the wafer 20. In FIG. 1, NA represents the numerical aperture of the objective lens 24, W represents the diffraction angle of the illumination beam and s represents the partial coherence value (i.e. % entrance pupil illuminated).

In off-axis or dark field illumination the illumination rays strike the object or reticle at an oblique angle. This is accomplished by blocking the normally incident zero order or undiffracted beam. For features smaller than the diffraction limited frequency as defined by the maximum diffraction angle accepted by the objective lens, only zero order or unmodulated light is transmitted through the lens. This unmodulated energy just adds to the modulated energy in the aerial image, reducing the image contrast. Off-axis illumination effectively blocks this light by shifting the zero order light to now be in the position of the maximum ±1 order diffracted beam accepted by the lens. This allows a larger ±1 order diffraction angle beam to be accepted by the lens. Image formation now occurs by the interference of two beams being the zero order and either the +1 or −1 diffracted beam. This is represented schematically in FIG. 1A. This effectively increases the resolution. The depth of focus is also significantly increased with this two beam image formation because there is less or theoretically no phase (optical path length) difference between the image formation beams in the defocus mode.

In theory, the image resolution for off axis illumination is two times the resolution of coherent illumination. The coherent illumination (i.e., illumination with normally (90°) incident rays) resolution limit can be represented as:

$RES_{cut-off}$=spatially coherent resolution limit $$=\frac{0.5\lambda}{NA}=\frac{\lambda}{2\sin(w)}$$

where NA is the numerical aperture of the objective lens, $\lambda$ is the illumination radiation wavelength, and w is the maximum acceptable diffraction angle.

The partially coherent resolution limit $$=\frac{0.5\lambda}{NA(1+s)}$$

where s=sigma=degree of partial coherence

The off axis illumination resolution limit is given by:

Off-axis resolution limit$_{cut-off}$ $$=\frac{0.5\lambda}{NA(1+s)+\theta}$$

where $\theta$=off-axis illumination incident angle on mask

When the source image is at the edge of the entrance pupil (i.e. $\theta$=NA(1−s)) then the off-axis illumination (i.e. oblique rays illuminating object) resolution limit can be represented by doubling the above equation as:

Off-axis resolution limit $$= \frac{0.25 \lambda}{NA} = \frac{\lambda}{4 \sin(w)}$$

w is the diffraction angle of a small opening "a" on the reticle given as:

m $\lambda$=asin (w)

where $\lambda$ is the actinic illumination wavelength;

w is the diffraction angle

Since 1989 there has been much published on the use of off-axis illumination for improving microlithographic performance. Some of these publications are listed in the Information Disclosure Statement filed herewith.

Although off-axis illumination results in improved depth of focus and resolution for microlithography, there are problems associated with this technique. One noted problem is the over exposure of the isolated features of a pattern. This situation occurs in a defocus mode and causes the projected exterior features of a repetitive pattern, or the exterior portions of features of the pattern, to degrade significantly from the dense line pattern. This condition is shown in FIGS. 2 and 3.

FIGS. 2 and 3, show two patterns projected onto a wafer in an off-axis illumination system during a defocus condition (i.e. non optimal z-position). In FIG. 2, the reticle pattern comprises a simple grating which includes parallel spaced solid lines 26 having a linewidth of LW. For a simple grating the linewidth LW also equals the space between the lines.

In the grating pattern of FIG. 2, the solid lines 26 are oriented generally perpendicular to the wafer flat. Because of the defocus condition, the exterior portions 28 of the solid lines 26 of the pattern projected onto the wafer (20 FIG. 1) have a degraded image profile. In addition, the exterior solid lines 30, 32 of the pattern are degraded. The top exterior line 30 is shown as having a curved profile and a linewidth that is much less than the desired linewidth LW. The bottom exterior line 32 is shown as having degraded exterior portions 28 and also degraded interior portions 29.

In FIG. 3, the solid lines 34 of a simple grating pattern are oriented generally parallel to the major flat of the wafer. Because of the defocus condition, the exterior portions 36 of the projected solid lines 34 have a degraded image profile. In addition, the exterior solid lines 38 and 40 of the pattern as a whole have a degraded curved profile substantially as shown. In addition, a width of the exterior lines 38 and 40 is less than a desired linewidth LW. At an extreme negative defocus conditions (e.g. 1.5 μ) the exterior linewidths 38, 40 (FIG. 3) or 30, 32 (FIG. 2) will vanish completely.

Such degraded profiles with off-axis or partially coherent illumination systems have been extensively documented in the art, (e.g., see the article "0.35 μm Lithography Using Off-Axis Illumination", Luehrmann et al., SPIE-Optical/Laser Microlithography VI Conference, March 1993, San Jose, Calif.).

This condition is also known as the "proximity effect" or "proximity image degradation". In general, the proximity effect refers to the exterior line or space degradation of a dense line-space structure in the defocus mode. It is theorized that the degraded exterior features are in proximity to larger "low resolution" areas that are void of patterns. These low resolution areas scatter light in the defocus mode causing the image degradation. The low frequency modulation degradation is due to optical path length differences between the zero and the ±1 orders required for image formation. Scattered or stray actinic radiation from the low resolution areas reduces the image contrast in the high resolution areas, which significantly degrades the image quality of these adjacent features.

Due to this image degradation problem, the contrast, resolution and depth of focus for lithographic systems that employ partially coherent or off-axis illumination is significantly impaired. Depth of focus is the maximum range the image plane (e.g. wafer) can move along the z axis and still produce an acceptable image or photoresist pattern. Acceptance is typically defined as a critical dimension range (physical size of photoresist pattern) of ±10% about some target dimension. This acceptable photoresist pattern must also have sidewalls that are not degraded by more that 5 degrees and a resist thickness loss less than 10%. These qualities are all relative to the best focus image plane position for achieving a resist pattern.

In view of the these shortcomings of microlithographic systems that utilize partially coherent or off-axis illumination, it is an object of the present invention to provide an improved reticle pattern for microlithographic systems that utilize partially coherent or off-axis illumination.

It is another object of the present invention to provide an improved reticle pattern for semiconductor lithography that improves the resolution, contrast and depth of focus for features projected onto a semiconductor wafer.

It is yet another object of the present invention to provide an improved reticle pattern for lithography suitable for use with off-axis or partially coherent illumination and in which submicron exterior features of a dense line-space pattern (e.g. periodic grating) are protected from degradation in a defocus mode of the system.

It is a further object of the present invention to provide an improved method of semiconductor lithography in which differences in the linewidth dimension between interior, exterior, and isolated features in a submicron resist pattern are improved.

It is a further object of the present invention to provide an improved reticle pattern for off-axis illumination in semiconductor lithography that overcomes the proximity effect.

It is a still further object of the present invention to provide an improved method of lithography and an improved reticle pattern that are suitable for large scale semiconductor manufacture.

SUMMARY OF THE INVENTION

In accordance with the present invention an improved method of lithography and an improved reticle pattern for lithography are provided. The improved reticle pattern is particularly adapted for use in semiconductor fabrication in lithographic processes which utilize off-axis illumination. The improved reticle pattern includes blinder structures that are placed on the outside of the exterior features of a primary pattern such as a dense line-space pattern. Each blinder structure is formed of one or more blinders. The blinders protect the exterior features of the primary pattern from light that is scattered from large low resolution areas of the reticle in a defocus mode.

In an illustrative embodiment the blinder structures are formed of pairs of parallel spaced solid lines. The thickness of the solid lines however, is below the resolution limit of the optical system, so that the images of the blinders do not print onto the semiconductor wafer. The blinders protect the exterior features of the reticle pattern from image degradation which results from scattered light and thus increase the depth of focus of the lithographic system. Stated differently, the blinders operate as dummy features which break-up the low resolution exterior areas of a dense line-space pattern but which do not print on the wafer.

The method of the invention can be practiced using a projection lithographic system suitable for semiconductor fabrication. Preferably the lithographic system includes a reduction lens so that the image printed on the wafer is reduced in size with respect to the primary reticle pattern. As an example, with a 5× reduction lens the reticle pattern can be made five times larger than the pattern that is printed on the wafer. The reticle can be formed using a high performance lithographic system such as an electron-beam mask writer.

The blinders can be utilized on many dense line-space exposure patterns that are useful for semiconductor manufacture. In an illustrative embodiment the blinders protect the exterior features of simple grating patterns. The blinders can be used to protect the exterior features of grating patterns having different configurations, sizes, periods and orientations. In addition, other dense line-space patterns including grids, circles and zone plates can be formed with protective blinders in accordance with the invention.

These and other objects, features and advantages of the invention will be apparent from the following more particular description of the preferred embodiments of the invention as illustrated in the accompanying drawings.

DETAILED DESCRIPTION OF THE PREFERRED EMBODIMENTS

Figures 4, 4A:
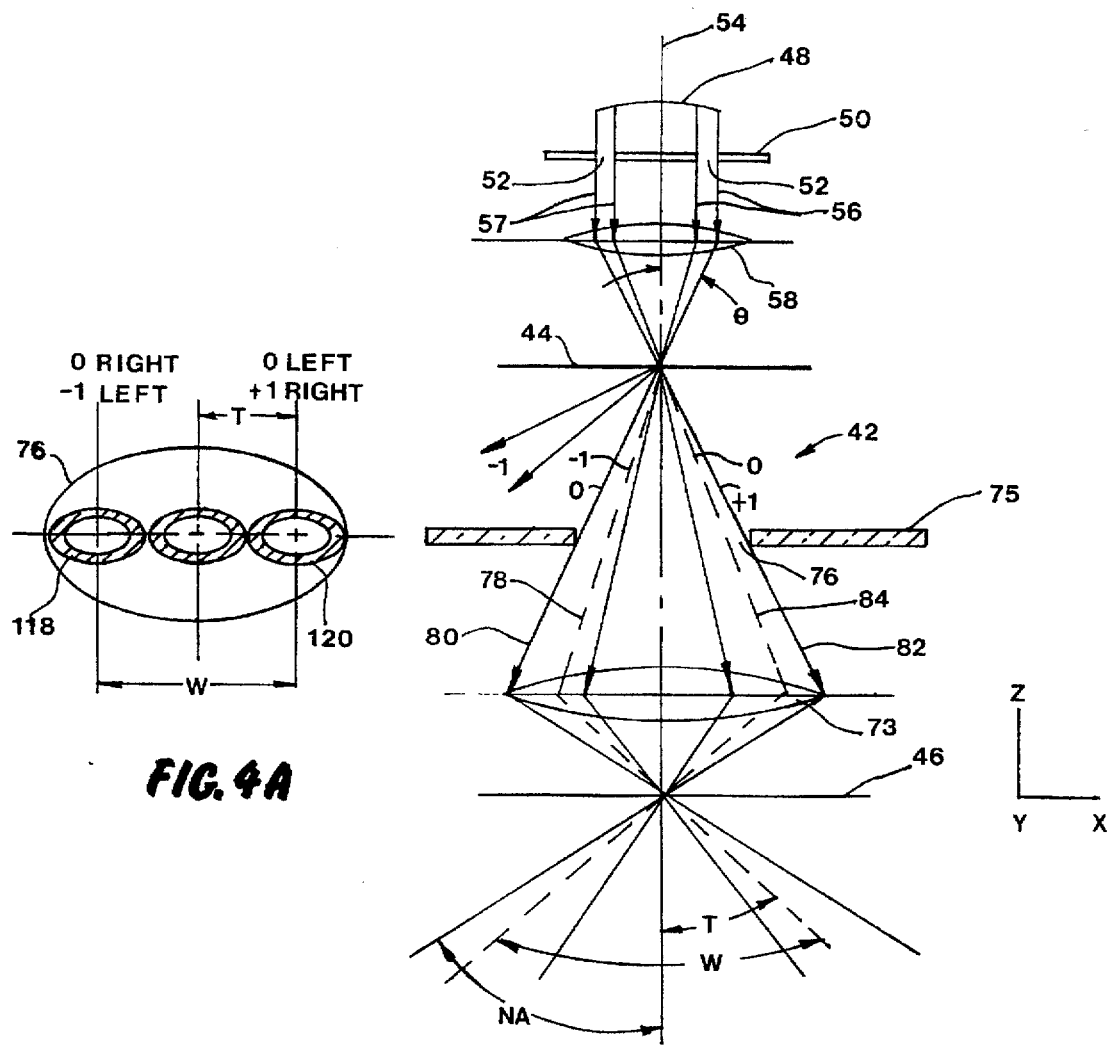
FIG. 4 is a schematic view of an optical lithographic system having off-axis illumination and employing a reticle having blinder structures constructed in accordance with the invention.
FIG. 4A is an enlarged plan view of an entrance pupil portion of the optical lithographic system of FIG. 4.

Referring now to FIG. 4, an off-axis illumination lithographic system 42 having a reticle 44 constructed in accordance with the invention is shown in a simplified diagrammatic form. The lithographic system 42 is a projection lithographic system suitable for semiconductor fabrication. In such a lithographic system 42 an image formed on a mask or reticle 44 is projected onto a semiconductor wafer 46. The image field is then repeated, or stepped, across the surface of the wafer 46 so as to transfer many copies of the pattern onto the wafer surface. The lithographic system 42 may be constructed with a magnification factor so that the image printed on the wafer 46 is reduced in size with respect to the image formed on the reticle 44. Such an off-axis lithographic system 42 is capable of transferring images having submicron sized features.

The off-axis illumination lithographic system 42 includes a source 48 of radiant energy situated along an optical axis 54 of the lithographic system 42. The radiant energy my be visible, UV, near-UV or deep UV light waves or X-rays. A screen 50 is positioned adjacent to the source 48. The screen 50 is formed with an annular aperture 52. The annular aperture 52 is designed to eliminate the center portion of the illumination beam emitted from the source 48. This blocks the on-axis 0 order unmodulated radiation and allows the illumination to come from illumination beams 56, 57 that are off-axis with respect to the optical axis 54 of the lithographic system 42. Illumination beams 56 are termed herein as the right side illumination beams. Illumination beams 57 are termed herein as the left side illumination beams.

The off-axis right and left side illumination beams 56, 57 are focused by a condenser 58 at an oblique angle onto the reticle 44 and illuminate the reticle 44. The reticle 44 is located at the object plane of the lithographic system 42. The reticle 44 is formed with various patterns (e.g. patterns shown in FIG. 5 and 6) which are desired to be produced on the face of the wafer 46.

After diffracting through the reticle 44 the diffracted illumination beams 56, 57 are filtered by a spatial filter 75 and focused by an objective lens 73 onto the wafer 46. The spatial filter 75 includes an entrance pupil 76 which is positioned to intercept the Fraunhofer diffraction pattern of the illuminated reticle 44. The entrance pupil 76 functions to prevent certain orders of the diffraction pattern from striking the wafer 46 at the image plane. Specifically the entrance pupil 76 of the spatial filter 75 accepts only the larger ±1 order diffraction angle beams. Image formation now occurs by the interference of two beams being the zero order and either the +1 or −1 diffracted beam.

After diffracting through the reticle 44 the −1 order beam 78 of the left illumination beam 57 travels the same path as the zero order beam 80 of the right illumination beam 56. Similarly, the +1 order beam 82 of the right illumination beam 56 and the zero order beam 84 of the left illumination beam 57 travel the same path. Even though there are four beams interfering at the image plane (78, 80, 82, 84), both pairs (78, 80) and (82, 84) of diffracted beams behave exactly the same. The effect is that of a single pair of beams. This is illustrated schematically in FIG. 4A where beam 118 represents the combination of the zero order right beam 80 (FIG. 4) and the −1 left beam 78 (FIG. 4). Beam 120 represents the combination of the 0 order left beam 84 (FIG. 4) and +1 right beam 82 (FIG. 4). Any two beams interfering to form a sinusoidal intensity pattern have infinite depth of focus. Since the incident angle θ of each beam is symmetric about the optical axis 54, the position of the maximum and minimum in the intensity pattern does not shift as the z-position (defocus) is changed. In FIG. 4, the numerical aperture of the entrance pupil 76 is denoted as NA. The diffraction angle is w and T represents the source image diameter.

The theoretical resolution limit for an off-axis lithographic system 42 is twice that of a partially coherent lithographic system 10 because the captured diffraction angle is doubled. The off-axis resolution limit can be represented by the previously stated equation:

Off-axis resolution $$= \frac{.25 \lambda}{NA} = \frac{\lambda}{4 \sin(w)}$$

For feature sizes below the coherent cut-off frequency, the contrast or image modulation is reduced because the optical path lengths for the zero order and the 1st order are not equal even at the best focus. This means that the off-axis illumination oblique angle incident on the reticle (θ) will determine the optimal resolution for the system. Optimal resolution here refers to that minimum equal line and space pair that has the highest contrast and greatest depth of focus, resulting from equivalent path lengths for the 0 and ±1 diffracted orders in the two beam interference image formation case. The relationship between illumination incident angle θ and optimal resolution is given as:

Off-axis resolution $$= \frac{\lambda}{2(NA + \sin\theta)}$$

θ is the off-axis illumination incident angle on the reticle 44 (i.e. object plane)

Figure 5:
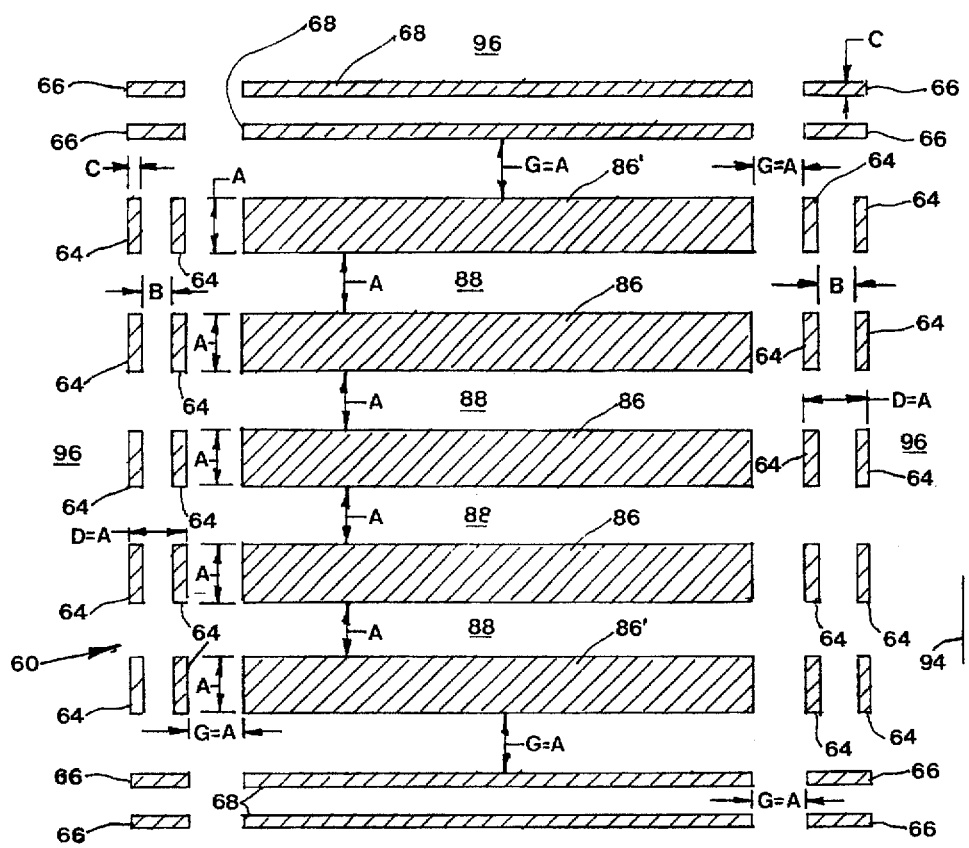
FIG. 5 is a plan view of a reticle pattern for a reticle of the lithographic system of FIG. 4, with the reticle pattern formed as a periodic grating and with pairs of blinders for protecting the exterior features of the pattern in accordance with the invention.
Figure 6:
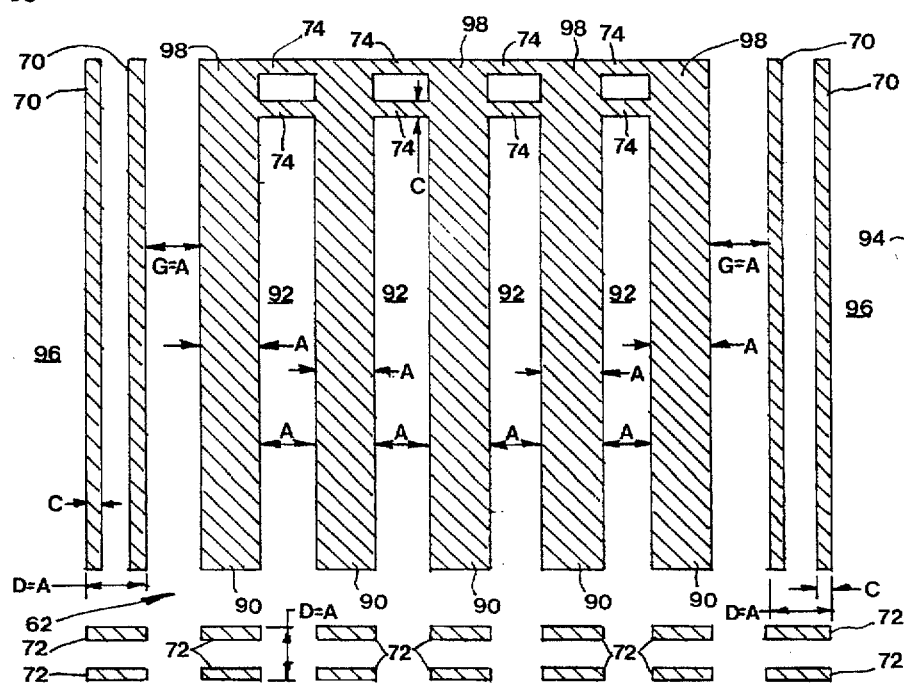
FIG. 6 is a plan view equivalent to FIG. 5 of another reticle pattern having blinders constructed in accordance with the invention.

In order to protect the exterior features of a pattern formed on the reticle 44 from image degradation the reticle pattern is formed with blinder structures. These blinder structures are shown in FIGS. 5 and 6. In FIG. 5, a primary reticle pattern 60 is a simple grating formed of solid lines 86 and spaces 88 (i.e. line-space pattern). A longitudinal axis of the solid lines 86 of the line-space pattern 60 is generally perpendicular to the major flat 94 of the semiconductor wafer 46 (FIG. 4). For a simple line-space grating pattern, the line width and spacing between the lines 86 are both equal to the dimension "A".

Another primary reticle pattern 62 is shown in FIG. 6. Reticle pattern 62 is basically the same simple line-space grating pattern as line-space pattern 60 (FIG. 5) but is rotated 90 degrees. The reticle pattern 62 is thus also formed with solid lines 90 and spaces 92 having a dimension of "A" but with the longitudinal axis of the lines 90 and spaces 92 generally parallel to the major flat 94 of the semiconductor wafer 46 (FIG. 4).

Referring back again to FIG. 5, the line-space pattern 60 also includes blinder structures comprising pairs of lateral edge blinders 64 located adjacent to the exterior lateral edges of each of the solid lines 86. The lateral edge blinders 64 are formed as solid lines. In addition, pairs of longitudinal edge blinders 66 and 68 are located adjacent to the longitudinal edges of the exterior lines 86' of the line-spaced pattern 60. Furthermore, pairs of blinders 66 are located adjacent to an upper and lower edge of the lateral edge blinders 64 spaced from and generally coincident to the lateral edge blinders 64.

The blinders 64, 68 function to protect the exterior portions of the lines 86 and the exterior lines 86' of the line-space pattern 60 from being degraded during the off-axis lithographic process. Each exterior edge (i.e. longitudinal or lateral) of the solid lines 86 of the line-space pattern are protected by a blinder (i.e. longitudinal edge blinders 68, lateral edge blinders 64). In addition, the upper and lower exterior ends of the lateral edge blinders 64 are protected by blinders 66.

Figures 1, 1A:
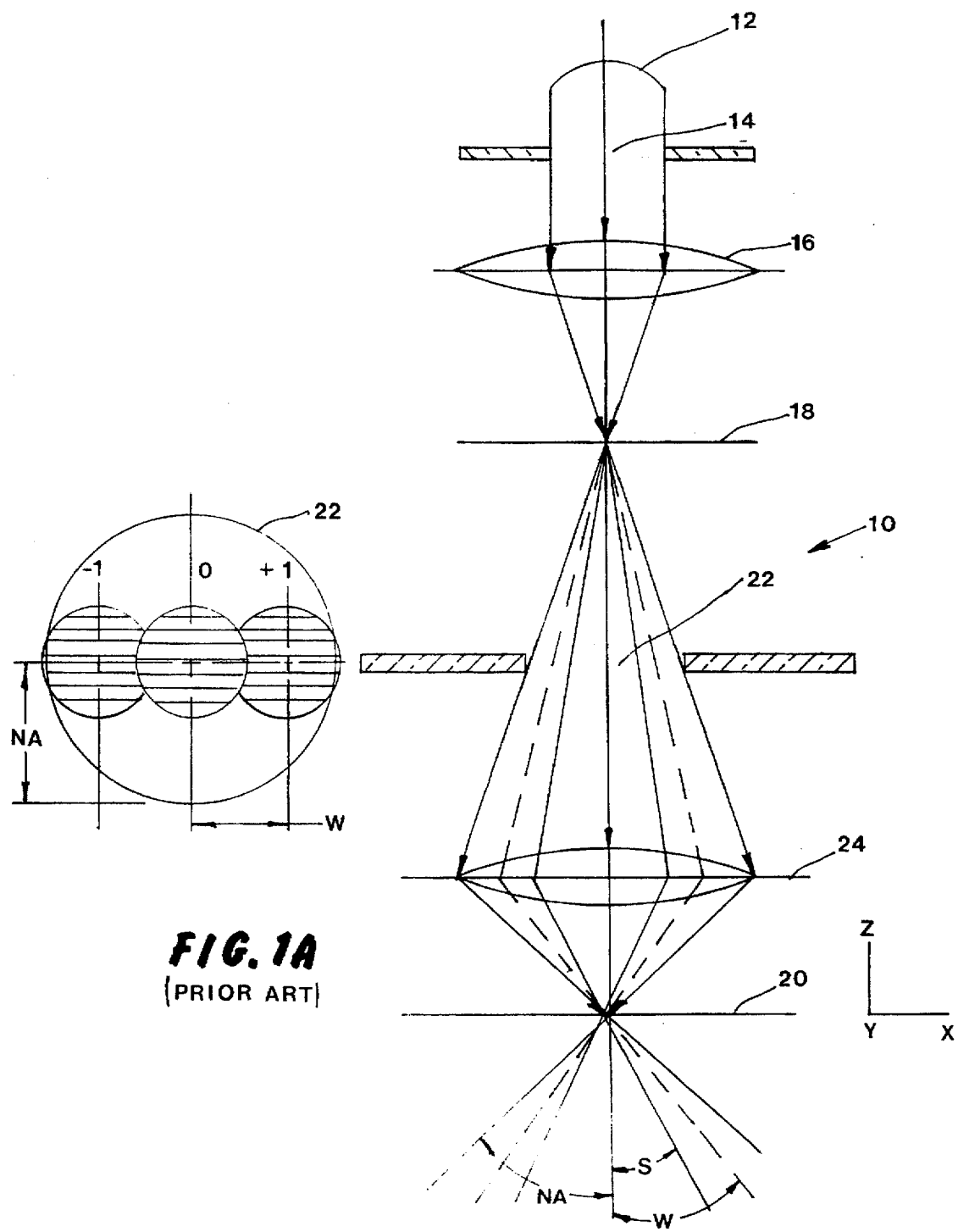
FIG. 1 is a schematic view of a prior art optical lithographic system that uses partially coherent illumination.
FIG. 1A is an enlarged plan view of an entrance pupil portion of the optical lithographic system of FIG. 1.
Figures 2, 3:
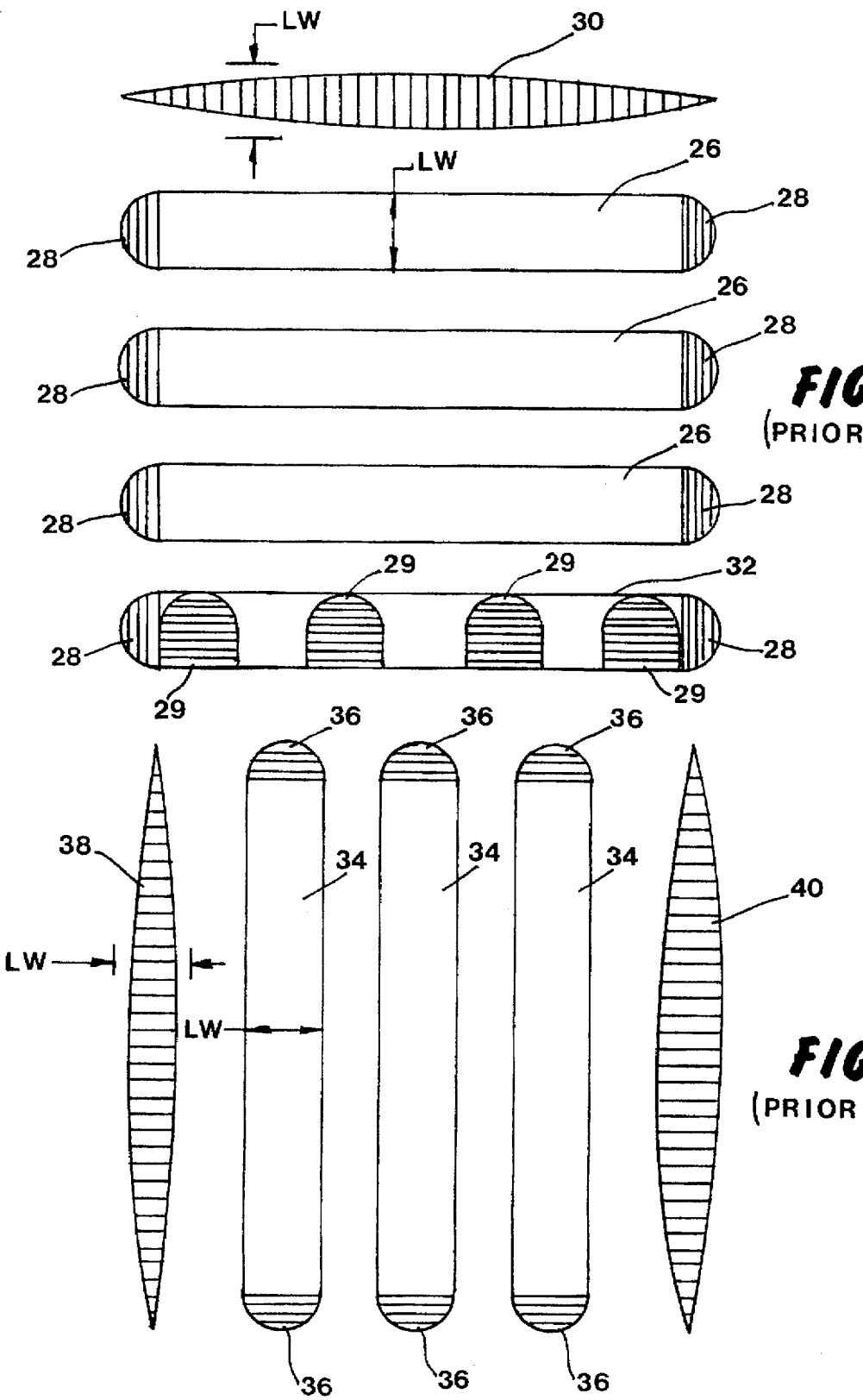
FIG. 2 is a plan view of a simple grating pattern formed on a semiconductor wafer during a prior art lithographic process showing the degradation of exterior features of the pattern.
FIG. 3 is a plan view of another simple grating pattern formed on a semiconductor wafer during a prior art lithographic process showing the degradation of exterior features of the pattern.

In general, the blinders 64, 66, 68 function to break up the large low resolution areas 96 (i.e. areas with no solid pattern) at the exterior edges of the line-space pattern 60. This helps to prevent scattered light which is diffracted from these low resolution areas 96 in the defocus mode of the off-axis illumination system 42 (FIG. 4). As previously explained, this scattered light causes image degradation of the exterior features of a dense line-space pattern (see FIG. 2 and 3). The reticle 44 can be formed using an electron beam lithographic system such as an electron beam mask writer. Initially, a mask blank can be provided. Standard mask blanks are manufactured and sold by mask makers for use in semiconductor manufacture. One supplier is DuPont Photoblanks of Poughkeepsie, N.Y. These mask blanks include a transparent substrate (e.g., quartz) and an opaque layer (i.e., chrome) deposited and planarized to a standard thickness (e.g., 800–1200 Å). Using the mask writer the opaque layer can be patterned and etched with a particular integrated circuit layout (e.g., FIGS. 5 and 6) for use in a semiconductor fabrication process.

For patterning and etching the opaque layer, a layer of e-beam resist can be deposited onto the opaque layer and exposed using the electron beam mask writer. One suitable electron beam resist is polybutene (PBS) deposited to a thickness of about 0.4 micron and baked at 120 degrees C. for 30 minutes. A suitable E-beam mask writer for exposing the resist is manufactured by ETEC Systems, Inc. 26460 Corporate Ave., Hayward, Calif. 94545 and is designated a MEBES$_{TM}$4500.

Next, the resist is developed to form a resist mask. One suitable developer is APT915 with methylisoamylketone (MIAK): 2-pentanone (80:20) baked at about 120° C. for about 30 minutes and descumed in a plasma unit. The resist mask can be used to etch the opaque layer to form the primary reticle pattern 60 and blinders 64, 66, 68. By way of example, an opaque layer formed of chrome can be wet etched in a mixture of acetic acid and ceric ammonium nitrate at about 20° C. One suitable wet etch is CR-14 manufactured by Cyantek Corporation. Following the wet etch, the resist mask can be removed using a wet chemical stripping process or a dry plasma etch process. For a quartz substrate and a metal opaque layer suitable wet chemical strippers include phenolic organic strippers, chromic and sulfuric acid mixtures, and solvent strippers.

The above process produces a reticle that can be used in a lithographic system such as lithographic system 42 (FIG. 4) having a reduction lens (i.e., objective lens 73—FIG. 4) placed between the reticle 44 and wafer 46. In this case the blinders 64, 66, 68 and features formed on the primary reticle pattern 60 can be made larger than the desired pattern on the wafer. In an illustrative embodiment the reduction from reticle to wafer is 5×. Reductions of 2×, 4×and 10×are also possible.

If the blinders 64, 66, 68 are formed as pairs of solid lines with a thickness or linewidth "C" which is below the resolution limit of the off-axis illumination system 42, an image of the blinders 64, 66, 68 will not print on the semiconductor wafer 46. For the pattern shown in FIG. 5 the resolution limit must be sufficient to provide a critical dimension of "A" which is the linewidth and spacing of the solid lines 86 of the line-space pattern 60. The thickness "C" of the blinders 64, 66, 68 must therefore be below this critical dimension of the pattern. By spacing the blinders 64, 66, 68 with a space B however between adjacent pairs of blinders (i.e. 64 or 66 or 68), the overall width "D" of a blinder structure can be made equal to the linewidth A of a solid line 86 of the line-space pattern 60. The overall size of a blinder structure thus matches the size of a solid line 86 which it protects. In addition, the space or gap "G" between the exterior edge of the solid lines 86 of the line-space pattern 60 and innermost edge of a pair of blinders 64 or 68 is preferably also equal to "A".

By way of example and not limitation, Table 1 lists suitable dimensions for the blinders 64, 66, 68 for the line-space pattern 60 shown in FIG. 5 for different critical dimensions "A".

The dimensions listed are for features sizes at the wafer 46. The dimensions in parenthesis are for feature sizes on the reticle 44 using a 5× reduction lens.

TABLE 1

All dimension in Microns

| | A | B | C | D | G |
|---|---|---|---|---|---|
| 1.) | 0.30 (1.50) | 0.10 (0.50) | 0.10 (.050) | 0.30 (1.50) | 0.30 (1.50) |
| 2.) | 0.35 (1.65) | 0.15 (0.75) | 0.10 (0.50) | 0.35 (1.65) | 0.35 (1.65) |
| 3.) | 0.40 (2.00) | 0.20 (1.00) | 0.10 (0.50) | 0.40 (2.00) | 0.40 (2.00) |
| 4.) | 0.45 (2.25) | 0.25 (1.25) | 0.10 (0.50) | 0.45 (2.25) | 0.45 (2.25) |
| 5.) | 0.50 (2.50) | 0.30 (1.50) | 0.10 (0.50) | 0.45 (2.50) | 0.50 (2.50) |
| 6.) | 0.60 (3.00) | 0.40 (2.00) | 0.10 (0.50) | 0.60 (3.00) | 0.60 (3.00) | where A = linewidth and spacing of lines of pattern
B = space between blinders
C = thickness of blinders
D = overall width of blinder structure
G = gap between blinder and an exterior edge of pattern Referring now to FIG. 6, the line-space reticle pattern 62 includes pairs of longitudinal edge blinders 70 located along the longitudinal edges of the solid lines 90 of the line-spaced pattern 62 and pairs of lateral edge blinders 72 located along the lateral edges of the lines 90 of the pattern 62. These blinders 70, 72 function substantially as previously explained, to prevent degradation of the the exterior features of the line space pattern 62. In addition as previously explained, the upper and lower ends of a blinder structure may also include a pair of blinders (e.g. longitudinal edge blinder 70 are protected by blinders 72).

The line-space pattern 62 of FIG. 6 also includes pairs of interior blinders 74 located along the exterior end portions 98 of the solid lines 90 of the line-space pattern 62 and in the spaces 92 between the solid lines 90 of the line-space pattern 62. The pairs of interior blinders 74 are oriented generally perpendicular to the solid lines 90 and within the spaces 92 of the line-space pattern 62. This is an alternate arrangement for protecting the exterior end portions 98 of the solid lines 90 of the line-space pattern 62 from degradation during a defocus condition.

Since the thickness "C" of the interior blinders 74 is less than the resolution limit of the lithographic system 42 these pairs of interior blinders 74 will not print on the wafer 46. The interior blinders 74 however, function to break up the continuity of the low resolution area 96 which extends into the spaces 92 of the line-space pattern 62.

It is to be understood that the two line-space patterns illustrated (60—FIG. 5 and 62—FIG. 6) are merely exemplary embodiments of the invention. Alternately, the exterior features of other dense line-space patterns may be protected from degradation by suitable blinder structures. Other dense line-space patterns that can be protected from degradation include: a phase-shifted grating that includes an extended gap between adjacent lines to provide a desired phase shift; a chirped grating that includes lines having an unequal width or spacing; a grid pattern formed of two intersecting gratings; a pattern of evenly spaced circles; or a Fresnel zone pattern. Each of these types of patterns may include exterior blinders for protecting the exterior features from degradation in a defocus mode of an off-axis or partially coherent illumination system.

Figure 7:
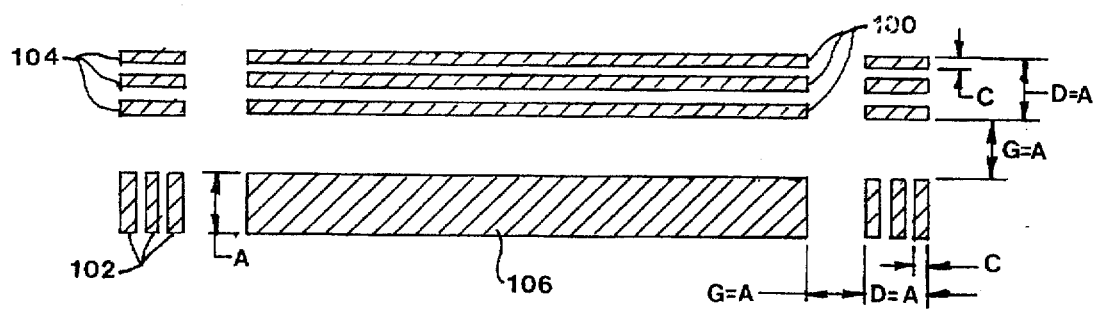
FIG. 7 is a plan view of a portion of a reticle pattern (i.e. one solid line) illustrating a blinder structure that includes three blinders for protecting the exterior features of the pattern in accordance with the invention.

Furthermore, although the blinder structures illustrated in FIGS. 5 and 6 are formed as pairs of solid lines, it is to be understood that less than or more than two blinders can be utilized for protecting the exterior features of a dense structure. As an example, FIG. 7 shows a part of a simple line-space grating pattern having spaced solid lines 106 (only one solid line 106 of the pattern is shown). The blinder structures of this embodiment are formed with three parallel spaced blinders 100, 102 or 104. As shown, the triple blinders 102 and 104 are spaced to provide an overall width "D" which is equal to the linewidth and spacing "A" of the pattern. In addition, a spacing G of any blinder 100, 102 or 104 from an edge (lateral or longitudinal) of the solid lines 106 of the pattern is equal to the linewidth and spacing "A" of the pattern. In addition the blinders 100, 102, 104 have a thickness C that is less than a resolution limit of the lithographic system. Triple blinders 100, 102 and 104 function substantially as previously explained for the pairs of blinders (FIGS. 5 and 6). Furthermore, interior blinders (not shown) equivalent to the interior blinders 74 shown in FIG. 6 can also be formed of three rather than two blinders.

Figure 8:
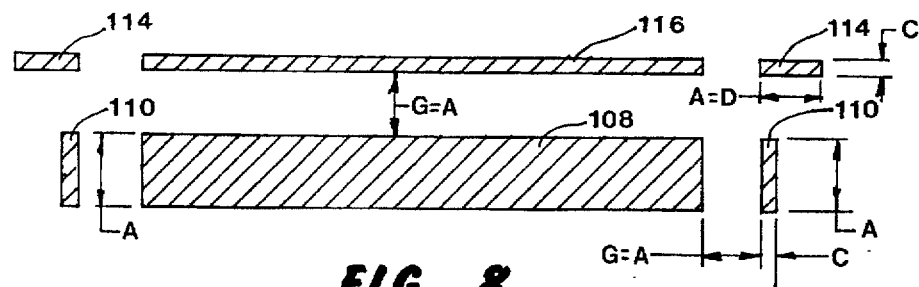
FIG. 8 is a plan view of a portion of a reticle pattern (i.e. one solid line) illustrating a blinder structure that includes single blinders for protecting the exterior features of the pattern in accordance with the invention.

Another example of a blinder structure is shown in FIG. 8. In FIG. 8, a part of a simple line-space grating pattern having spaced solid lines 108 is shown. For simplicity only, one solid line 108 of the pattern is shown. The blinder structures 110, 114, 116 of this embodiment are formed with a single blinder line having a thickness "C" that is less than a resolution limit of the lithographic system. In addition, blinder lines 110, 114 are spaced a distance of "G" from an exterior edge (lateral or longitudinal) of the solid lines 108 of the pattern that is equal to the linewidth and spacing "A" of the pattern. A width "D" of blinder lines 114 is also equal to the dimension "A". Single blinders 110, 114, 116 function substantially as previously explained for the pairs of blinders (FIGS. 5 and 6). Furthermore, interior blinders (not shown) equivalent to the interior blinders 74 shown in FIG. 6 can also be formed of one rather than two blinder lines.

Analysis:

As used herein the term MTF refers to the Modulation Transfer Function defined as the ratio of the modulation in the image plane to that in the object plane (i.e., $M_{im}/M_{mask}$ where M=modulation). The term CD refers to critical dimension control. In addition, the terms reticle and mask are sometimes used interchangeably.

All diffracted points in the entrance pupil resulting from object slit openings of width "a" spaced on 2a separation forming a grating pattern will have a phase correlation based on the diffraction equation:

$m\lambda = a\sin(w)$

λ is the actinic illumination wavelength;

w is the diffraction angle (where m is the diffraction order 1, 3, 5 etc.). As the slit opening is made smaller the diffraction angle w increases until these diffracted orders are no longer captured by the objective lens due to its physical diameter. This limiting feature size is defined as the cutoff frequency or diffraction limited resolution. The objective lens diameter is defined by the numerical aperture NA which is given as:

$$NA = n\sin(w) = \frac{D}{2f} = \frac{\lambda}{2\,RES}$$

D=objective lens diameter;
f=objective lens focal length
RES=limiting resolution for partially coherent illumination
w=maximum diffraction angle accepted by projection lens resulting from the RES feature.

For the periodic structure evaluated here with a coherent illumination resolution RES the diffraction angle is given by the equation:

$$\sin(w) = \frac{m\lambda}{2\,RES}$$

$\lambda$ is the actinic illumination wavelength;
w is the diffraction angle resulting from the RES feature
RES=limiting resolution for coherent illumination The spatially coherent illumination resolution limit can be represented by letting w equal the maximum diffraction angle accepted by projection lens with numerical aperture NA and combining the above equations to obtain the well known equation:

$RES_{sc\ cutoff}$=spatially coherent resolution $$= \frac{0.5\,\lambda}{NA} = \frac{\lambda}{2\sin(w)}$$

For spatially coherent illumination, these diffraction patterns will image as separate points in the entrance pupil. The image of this grating pattern is reconstructed by the interference between the zero order and all fully transmitted diffraction orders. This is typically described as image formation by 3 beam (0, −1 and +1 diffracted orders) interference. For spatially coherent illumination the image is an exact reconstruction of the object up to the limiting coherent cut-off frequency (when Modulation Transfer Function (MTF)=0) given by:

$$v_c = \frac{NA}{\lambda}$$

$\lambda$ is the actinic illumination wavelength;
NA is the objective lens numerical aperture The exact reconstruction for a given frequency is defined when the MTF is 1.0 or 100% modulation. The illumination is described as spatially incoherent when the effective source is infinite in extent, but more practically when the source image size is the exact size of the entrance pupil. The degree of coherence is given by: s=source image diameter/entrance pupil diameter. Incoherent illumination sigma=1.0 and coherent sigma=0.0. For spatially incoherent illumination the limiting cut-off frequency is given by:

$$v_c = \frac{2\,NA}{\lambda}$$

$\lambda$ is the actinic wavelength;
NA is the objective lens numerical aperture.

If this projected source image diameter is increased, but made smaller than the entrance pupil diameter, then the illumination is said to be partially coherent. With incoherent illumination features smaller than the coherent, cut-off frequency will only transmit low modulation light through the lens. This low modulated energy from the high frequency features diffracted light just acts as scattered light, which reduces the image contrast for larger features. Thus by filtering or blocking this low modulation light from these high frequency features, diffracted orders with more coherent illumination, the image contrast and modulation is increased for features below the partially coherent cutoff frequency.

For partially coherent illumination, the limiting cutoff resolution depends on the degree of coherence and is given by:

$RES_{pc\ cutoff}$=partially coherent resolution $$= \frac{0.5\,\lambda}{NA\,(1+s)}$$

where s is the degree of partial coherence

When the illumination is made more coherent the absolute resolution of the optic system is decreased but the contrast of the medium frequencies are increased. This contrast increase can result in a slight effective resolution increase for certain feature frequencies and shapes. It has been shown that square clear apertures or a contacts depth of focus can be increased by increasing the coherence of the illumination.

Depth of focus is given by the expression:

$$DOF = \frac{k2\,\lambda}{NA^2}$$

where k1 and k2 are factors dependent on the photoresist process;
$\lambda$ is the actinic illumination wavelength;
NA is the objective lens numerical aperture.

CD, image quality, and sidewall angle requirements define the practical tolerances. These image structure parameters are degraded in the defocus mode by a loss in image contrast caused by the optical path length differences between the 0 and ±1st order diffracted rays. Since image formation with partially coherent illumination occurs from the interference of the 3 diffract order beams, there is always a contrast loss in the de-focus mode. This contrast loss is due to the phase difference between the two first order beams with respect to the 0 order.

For features smaller than a cut-off frequency only zero order or unmodulated light is transmitted through the lens. This is due to the large diffraction angles for ± orders falling outside the entrance pupil for these small features. This unmodulated energy just adds to the modulated energy in the aerial image, reducing the image contrast. Thus by blocking this unmodulated 0 order light from these high frequency features diffracted orders with annular or oblique illumination, the image contrast and modulation is increased for features between the incoherent and coherent cutoff frequencies. This increased modulation significantly increases the resolution of the system. The illumination effectively moves the 0 order light causing it to be incident on the object at an oblique angle, which allows the lens to capture this 0 order and one 1st order. This type of image formation is called 2 beam interference. Off-axis illumination allows the objective lens to capture larger diffraction angle beams that partially coherent illumination, resulting in a higher resolution capabilities for the projection system.

The off axis illumination limiting resolution is given by the below equation:

Off-axis $RES_{cutoff}$ $$= \frac{0.5 \lambda}{NA(1+s) + \theta}$$

θ=off-axis illumination incident angle on reticle

When the source is at the edge of the entrance pupil [θ=NA (1−s)] the off-axis illumination resolution limit can be represented as:

Off-axis resolution $$= \frac{0.25 \lambda}{NA} = \frac{\lambda}{4 \sin(w)}$$

The theoretical resolution limit for an off-axis illumination system is twice that of a coherent system as given by the above equation and because the captured diffraction angle is doubled. Comparing typical partially coherent systems (s=0.70 and 0.40) with off-axis illumination, the theoretical resolution is increased 20 to 40%. The resolution improvement factor of off-axis illumination over partially coherent illumination can be given as:

Resolution improvement factor for off-axis illumination X $$= \frac{2}{(1+s)}$$

X=number of times resolution with off-axis illumination is improved over partially coherent s=sigma=degree of partial coherence The theoretical partially coherent illumination resolution limit of a partially coherent lithographic system (NA=0.48, 5× reduction and an illumination wavelength of 0.365 microns) is about 0.38 microns while the resolution limit for an off-axis lithographic system is about 0.19 microns. In practice the actual partially coherent resolution limit is about 0.50 microns, while the annular off-axis illumination resolution is about 0.35 microns. This is a 1.43× resolution improvement.

Another important feature of an off-axis illumination lithographic system is that the depth of focus is improved due to less phase difference between the two beam image formation in the de-focus mode. When the image focal plane is shifted in the z-axis, the optical path lengths for the two interfering beams involved in image formation are effectively equivalent. This means that the image contrast is not de-graded in the defocus mode and thus the depth of focus for off-axis illumination is significantly greater than partially coherent illumination. This depth of focus improvement using off-axis illumination is its greatest benefit. This depth of focus of an off-axis lithographic system can be improved even more by forming the reticle with blinders in accordance with the invention.

Although the invention has been described in terms of preferred embodiments, as will be apparent to those skilled in the art other applications of the inventive concepts disclosed herein are possible. It is intended therefore that the following claims include such alternate embodiments.

What is claimed is:

1. A lithographic method comprising:
providing a lithographic apparatus having partially coherent or off-axis illumination;
providing a reticle configured for use with the lithographic apparatus to project a pattern onto a target;
forming a blinder structure including at least two parallel spaced blinders in an area of the reticle adjacent to an edge of a protected feature of the pattern, said blinders having a thickness below a resolution limit of the lithographic apparatus, said blinder structure having an overall width equal to a width of the protected feature, said overall width inclusive of the thicknesses of the blinders and a spacing between the blinders.

2. The method as claimed in claim 1 wherein the protected feature comprises a line and the blinder structure is parallel to and spaced from an exterior edge of the line by a distance equal to a linewidth of the line.

3. The method as claimed in claim 1 wherein the blinder structure comprises a pair of parallel spaced solid blinder lines.

4. The method as claimed in claim 1 and wherein the blinder structure comprises three parallel spaced solid blinder lines.

5. The method as claimed in claim 1 wherein the pattern comprises a plurality of spaced lines and the blinder structure is formed in a space between the lines adjacent to an end portion of the lines and generally perpendicular to the lines.

6. The method as claimed in claim 1 and further comprising forming a second blinder structure adjacent to an edge of the blinder structure, said second blinder structure comprising at least two parallel spaced blinder lines.

7. A lithographic method comprising:
providing a lithographic apparatus having partially coherent or off-axis illumination;
forming a reticle configured for use with the lithographic apparatus to project a primary pattern on a target, said primary pattern including parallel spaced lines;
forming a plurality of blinder structures in areas of the reticle adjacent to exterior longitudinal and lateral edge portions of the lines of the primary pattern to prevent scattered light from the areas from degrading a projected image of the lines of the primary pattern;
said blinder structures each comprising at least two parallel spaced blinder lines, each blinder line having a thickness that is less than a resolution of the lithographic apparatus and with an overall width of each blinder structure inclusive of the thicknesses of the blinder lines and a spacing between the blinder lines for each blinder structure, equal to a linewidth of a single line of the primary pattern.

8. The method as claimed in claim 7 wherein at least one of the blinder structures is spaced from a longitudinal edge of an exterior line of the line-space pattern by a distance equal to the linewidth.

9. The method as claimed in claim 7 wherein at least one of the blinder structures is spaced from an exterior lateral edge of the lines of the line-space pattern by a distance equal to the linewidth.

10. The method as claimed in claim 7 wherein at least one of the blinder structures is generally perpendicular to a longitudinal edge of the lines of the line-space pattern and is located within a space between the lines.

11. The method as claimed in claim 7 wherein each blinder structure comprises two parallel spaced blinder lines.

12. The method as claimed in claim 7 wherein each blinder structure comprises three parallel spaced blinder lines.

13. The method as claimed in claim 7 and further comprising forming additional blinder structures adjacent to and spaced from exposed edges of the blinder structures.

14. A lithographic method comprising:
providing a lithographic apparatus having partially coherent or off-axis illumination;

providing a reticle configured for use with the lithographic apparatus and including a pattern of parallel spaced lines each having an equal linewidth;

forming blinder structures in areas of the reticle adjacent to exterior edge portions of the lines to prevent scattered light from the areas from degrading an image of the lines, said blinder structures comprising at least two blinder lines, each said blinder line having a thickness that is less than a resolution of the lithographic apparatus, each said blinder structure spaced from a corresponding exterior edge by a distance equal to the linewidth.

15. The method as claimed in claim 14 wherein the blinder structures comprises at least two parallel spaced blinder lines having an overall width equal to the linewidth.

16. The method as claimed in claim 14 wherein some of the blinder structures are formed by blinder lines parallel to and spaced from a longitudinal edge of exterior lines of the pattern.

17. The method as claimed in claim 14 wherein some of the blinder structures are formed by blinder lines parallel to and spaced from a lateral edge of exterior lines of the pattern.

18. The method as claimed in claim 14 wherein each blinder structure comprises three parallel spaced blinder lines.

19. A lithographic method comprising:

providing a lithographic apparatus having partially coherent or off-axis illumination;

forming a reticle configured for use with the lithographic apparatus and having a primary pattern comprising spaced lines;

forming blinder structures in areas of the reticle adjacent to edge portions of the lines to prevent scattered light from the areas from degrading an image of the lines, said blinder structures each comprising at least two parallel spaced blinder lines, each said blinder line having a thickness that is less than a resolution of the lithographic apparatus;

said blinder structures having an overall width inclusive of the blinder lines that is approximately equal to a linewidth of a single line of the primary pattern, and at least some of said blinder structures having an associated blinder structure for protecting an exposed edge thereof.

20. The method as claimed in claim 19 wherein forming the reticle is performed using an electron beam mask writer.

21. The method as claimed in claim 19 wherein forming the blinder structures is performed using an electron beam mask writer.

22. The method as claimed in claim 19 wherein the reticle comprises a transparent substrate and a metal layer formed thereon.

23. The method as claimed in claim 19 and further comprising placing a reduction lens between the reticle and a target.

24. The method as claimed in claim 23 and wherein the reduction lens comprises a 5× reduction lens.

* * * * *